(12) United States Patent
Chung et al.

(10) Patent No.: US 9,881,842 B1
(45) Date of Patent: Jan. 30, 2018

(54) WIMPY AND NOMINAL SEMICONDUCTOR DEVICE STRUCTURES FOR VERTICAL FINFETS

(71) Applicant: International Business Machines Corporation, Armonk, NY (US)

(72) Inventors: Kisup Chung, Slingerlands, NY (US); Su Chen Fan, Cohoes, NY (US); Catherine B. Labelle, Albany, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/466,976

(22) Filed: Mar. 23, 2017

(51) Int. Cl.
| | |
|---|---|
| *H01L 21/84* | (2006.01) |
| *H01L 21/66* | (2006.01) |
| *H01L 21/67* | (2006.01) |
| *H01L 21/324* | (2006.01) |

(52) U.S. Cl.
CPC ............ *H01L 22/20* (2013.01); *H01L 21/324* (2013.01); *H01L 21/67115* (2013.01); *H01L 21/67259* (2013.01); *H01L 21/67288* (2013.01)

(58) Field of Classification Search
None
See application file for complete search history.

(56) References Cited

U.S. PATENT DOCUMENTS

| | | | | |
|---|---|---|---|---|
| 8,099,686 B2* | 1/2012 | Schultz | ............... | G06F 17/5068 716/101 |
| 8,450,833 B2* | 5/2013 | Kim | ................... | H01L 21/0337 257/618 |
| 8,802,565 B2* | 8/2014 | Hartig | ............. | H01L 21/823456 257/E21.159 |
| 9,029,172 B2* | 5/2015 | Chen | ..................... | H01L 22/34 438/14 |
| 9,252,145 B2 | 2/2016 | Basker et al. | | |
| 9,368,572 B1 | 6/2016 | Cheng et al. | | |
| 9,466,669 B2 | 10/2016 | Rodder et al. | | |
| 9,601,335 B2* | 3/2017 | Greene | ............. | H01L 21/28123 |
| 9,601,366 B2* | 3/2017 | Greene | ............. | H01L 21/28123 |
| 2010/0248481 A1* | 9/2010 | Schultz | ............... | G06F 17/5068 438/694 |
| 2012/0043646 A1* | 2/2012 | Kim | ................... | H01L 21/0337 257/618 |

(Continued)

*Primary Examiner* — David E Graybill
(74) *Attorney, Agent, or Firm* — Garg Law Firm, PLLC; Rakesh Garg; David M. Quinn

(57) ABSTRACT

A first and second vertical fin are formed on a substrate structure. A dielectric layer is disposed on the substrate structure and the first and second vertical fins. A work function metal (WFM) layer is disposed on the dielectric layer. A first sidewall spacer and a second sidewall space are formed proximate to the first vertical fin and the second vertical fin, respectively. A lithographic mask is applied to a first area proximate to the first vertical fin including the first vertical fin, and a portion of the WFM layer proximate to the first vertical fin. A portion of the WFM layer proximate to the second sidewall spacer is recessed below an upper surface of the second sidewall spacer. The lithographic mask is removed. A portion of the dielectric layer is removed to produce a wimpy vertical transport device and a nominal vertical transport device on the substrate structure.

20 Claims, 15 Drawing Sheets

(56) References Cited

U.S. PATENT DOCUMENTS

| | | | |
|---|---|---|---|
| 2013/0191047 A1* | 7/2013 | Chen | H01L 22/34 |
| | | | 702/58 |
| 2014/0070414 A1* | 3/2014 | Hartig | H01L 21/823456 |
| | | | 257/741 |
| 2015/0380548 A1 | 12/2015 | Wang et al. | |
| 2016/0087099 A1* | 3/2016 | Moroz | H01L 29/66795 |
| | | | 257/190 |
| 2016/0293737 A1* | 10/2016 | Liu | H01L 29/66545 |
| 2016/0322497 A1* | 11/2016 | Huang | H01L 29/7848 |
| 2016/0329331 A1* | 11/2016 | Tsai | H01L 21/76224 |
| 2017/0025313 A1* | 1/2017 | Ching | H01L 21/823807 |
| 2017/0033000 A1* | 2/2017 | Greene | H01L 21/28123 |
| 2017/0033196 A1* | 2/2017 | Greene | H01L 21/28123 |
| 2017/0054027 A1* | 2/2017 | Liu | H01L 29/7855 |
| 2017/0062427 A1* | 3/2017 | Basker | H01L 21/823821 |
| 2017/0141226 A1* | 5/2017 | Jacob | H01L 29/7848 |
| 2017/0141227 A1* | 5/2017 | Jacob | H01L 29/7848 |
| 2017/0207126 A1* | 7/2017 | Ching | H01L 21/823431 |
| 2017/0229558 A1* | 8/2017 | Anderson | H01L 29/66795 |

* cited by examiner

US 9,881,842 B1

WIMPY AND NOMINAL SEMICONDUCTOR DEVICE STRUCTURES FOR VERTICAL FINFETS

TECHNICAL FIELD

The present invention relates generally to a method, system, and computer program product for fabricating wimpy and nominal semiconductor device structures. More particularly, the present invention relates to a method, system, and computer program product for fabricating wimpy semiconductor device structures and nominal semiconductor device structures for vertical transport fin-Field Effect Transistors (finFETs) on a common substrate.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A fin-Field Effect Transistor (finFET) is a non-planar device in which a source and a drain are connected using a fin-shaped conducting channel (fin) above the insulator layer. In an FET, a gate has a source-side and a drain-side. Generally, a finFET is fabricated as a multi-gate device in which two or more gates are coupled using one or more fin structures by connecting a drain of one gate to the source of another gate using a fin. For example, a fin of a finFET is usually fabricated between two gates such that the source of one gate is on one side of the fin and the drain of the other gate is on an opposite side of the fin. The direction along the lateral length of the fin running from one gate to the other gate is referred to herein as a lateral running direction of the fin.

FinFET structures that are used in semiconductor devices include lateral transport finFET structures and vertical transport finFET structures. In a lateral transport finFET, the fin structure extends laterally along a surface of the semiconductor device when viewed from above. In a vertical transport finFET, the fin structure extends vertically from a surface of the semiconductor device when viewed from above.

Further, vertical transport finFETs are generally fabricated as either nominal vertical transport finFETs or wimpy vertical transport finFETs. In a nominal vertical finFET, an upper surface of the gate of the finFET is below an upper surface of a dielectric material positioned between the gate and the fin. Accordingly, in a nominal vertical transport finFET, the gate does not extend along the entire height of the dielectric. In a wimpy vertical transport finFET, the upper surface of the gate of the finFET is substantially the same height as the upper surface of the dielectric material. Accordingly, in a wimpy vertical transport finFET, the gate extends substantially along the entire height of the dielectric resulting in a slightly larger gate length than for nominal finFET devices. In vertical transport finFET, the gate length (Lg) is dictated by the vertical height of the metal gate. A typical value of Lg for a nominal vertical transport finFET is approximately 15 nm, and a typical value of Lg for a wimpy vertical transport finFET is approximately 20 nm.

The illustrative embodiments recognize that the present methods and techniques for fabricating a finFET suffer from several problems. For example, nominal finFETs and wimpy finFETs each have different performance characteristics and thus it may be desirable to choose either a nominal finFET or a wimpy finFET based upon the particular requirements of a semiconductor device. For example, a larger gate length provides for lower leakage and variability. Due to the slightly larger gate length of the wimpy finFET, the device drive current of the wimpy finFET is lower than that of a nominal finFET. In addition, it may be desirable to include a mixture of nominal finFETs and wimpy finFETs on the same substrate such as in certain complementary metal oxide semiconductor (CMOS) product applications.

The illustrative embodiments further recognize that it is difficult to fabricate nominal vertical finFETs and wimpy vertical finFETs on the same substrate. Therefore, a method for fabricating nominal vertical finFETs and wimpy vertical finFETS on the same substrate would be useful.

SUMMARY

The illustrative embodiments provide a method, system, and computer program product. An embodiment includes a method including forming a first vertical fin and a second vertical fin on a substrate structure. A dielectric layer is disposed on the substrate structure, the first vertical fin, and the second vertical fin. A work function metal (WFM) layer is disposed on the dielectric layer. The first vertical fin and the second vertical fin are each substantially orthogonal to a plane of the substrate structure such that a source to drain flow in the first vertical fin occurs in a substantially perpendicular direction relative to the plane of the substrate. The embodiment further includes forming a first sidewall spacer proximate to the first vertical fin and a second sidewall spacer proximate to the second vertical fin. The embodiment further includes applying a lithographic mask to a first area proximate to the first vertical fin including the first vertical fin, and a portion of the WFM layer proximate to the first vertical fin. The embodiment further includes recessing a portion of the WFM layer proximate to the second sidewall spacer below an upper surface of the second sidewall spacer. The embodiment further includes removing the lithographic mask from the first area proximate to the first vertical fin. The embodiment further includes removing a portion of the dielectric layer to produce a wimpy vertical transport device and a nominal vertical transport device on the substrate structure.

An embodiment further includes further applying the lithographic mask to a portion of the dielectric layer proximate to the first vertical fin, and the first sidewall spacer. An embodiment further includes removing, as a part of removing the portion of the dielectric layer, a portion of the dielectric layer that is unprotected by a remaining portion of the WFM layer. An embodiment further includes etching, as a part of removing the portion of the dielectric layer, the portion of the dielectric layer.

An embodiment further includes wherein a conformal mask layer disposed on the work function metal layer. An embodiment further includes forming the first sidewall spacer and the second sidewall spacer from the conformal mask layer. An embodiment further includes wherein forming the first sidewall spacer and the second sidewall spacer comprises etching a portion of the conformal mask layer, and etching the first self-aligned sidewall spacer and the second self-aligned sidewall spacer to a desired gate length of the wimpy vertical transport device.

An embodiment further includes performing the etching of the first sidewall spacer and the second sidewall spacer using a reactive-ion etching (RIE) process. An embodiment further includes etching the WFM layer to remove a portion of the WFM layer extending to the dielectric layer to form a gate of the wimpy vertical transport device.

An embodiment further includes performing the recessing of the portion of the WFM layer proximate to the second sidewall spacer by etching the portion of the WFM layer proximate to the second sidewall spacer below an upper surface of the second sidewall spacer. An embodiment further includes performing the etching of the portion of the WFM layer proximate to the second sidewall spacer using a reactive-ion etching (RIE) process.

An embodiment further includes performing the removing of the lithographic mask from the first area by stripping the lithographic mask from the first area. An embodiment further includes depositing a conformal layer to encapsulate the wimpy vertical transport device and the nominal vertical transport device. An embodiment further includes wherein the wimpy vertical transport device is a wimpy vertical transport finFET, and wherein the nominal vertical transport device is a nominal vertical transport finFET.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
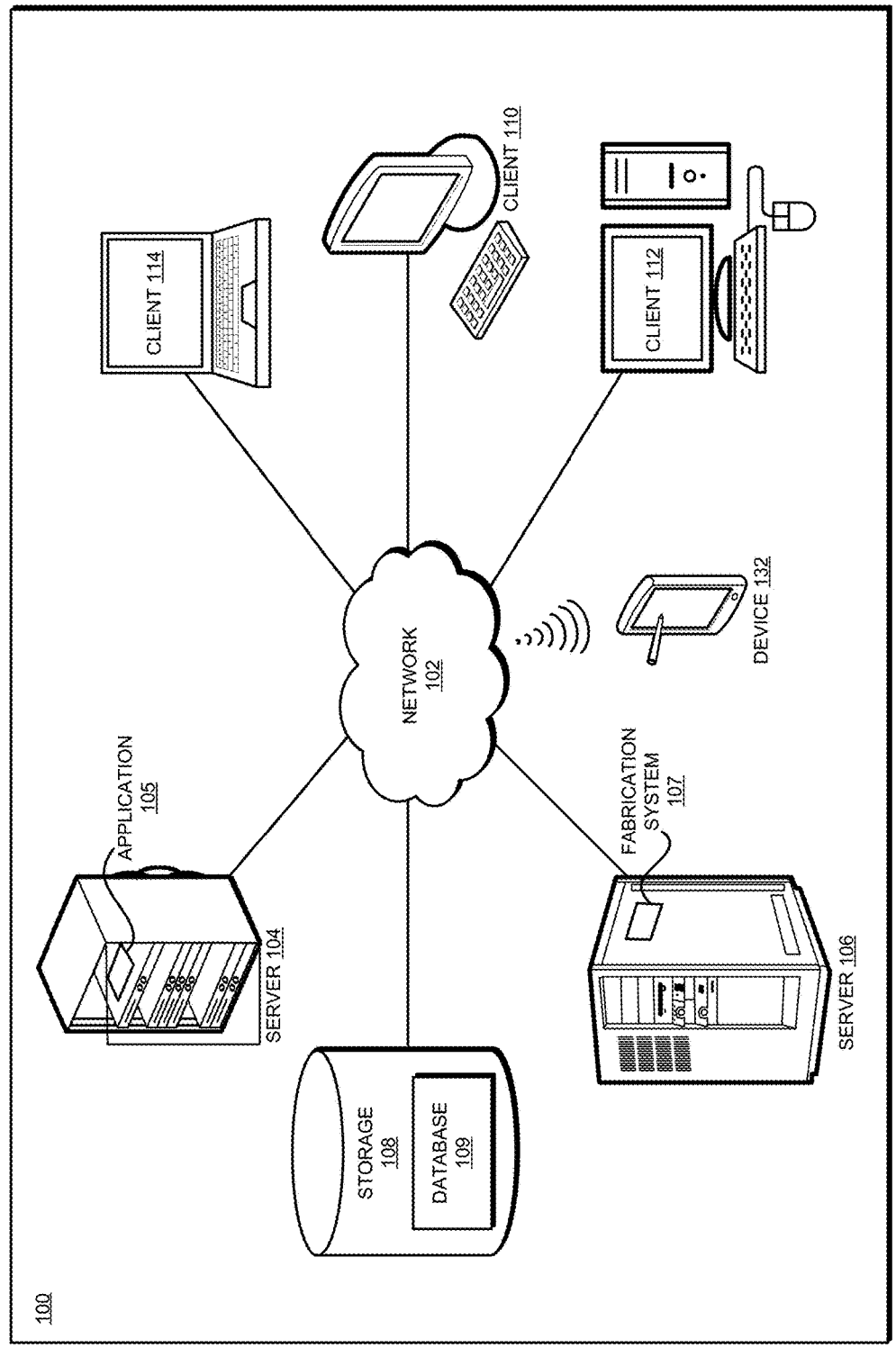
FIG. 1 depicts a block diagram of a network of data processing systems in which illustrative embodiments may be implemented.

The illustrative embodiments used to describe the invention generally address and solve the above-described problems and other problems related to fabricating nominal vertical transport (VT) finFETs and wimpy vertical transport (VT) finFETs on the same substrate.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate nominal vertical transport (VT) finFETs and wimpy vertical transport (VT) finFETs on the same substrate.

For the clarity of the description, and without implying any limitation thereto, the illustrative embodiments are described using a two-gate nominal and wimpy finFET where the gates are coupled using a fin. An embodiment can be implemented with a different number of gates, different number of fins, or both, within the scope of the illustrative embodiments.

Furthermore, a simplified diagram of the example finFETs are used in the figures and the illustrative embodiments. In an actual fabrication of a finFET, additional structures that are not shown or described herein may be present without departing the scope of the illustrative embodiments. Similarly, within the scope of the illustrative embodiments, a shown or described structure in the example finFETs may be fabricated differently to yield a similar operation or result as described herein.

Differently shaded portions in the two-dimensional drawing of the example finFETs are intended to represent different structures in the example finFETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a finFET according to the illustrative embodiments.

Furthermore, the illustrative embodiments are described with respect to a finFET only as an example. The steps described by the various illustrative embodiments can be adapted for fabricating other planar and non-planar devices employing vertical transport in a similar manner, and such adaptations are contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating finFET devices in which a nominal vertical transport finFET device and a wimpy vertical transport finFET device are fabricated on the same substrate. For example, presently available methods for fabricating finFET devices do not allow a nominal vertical transport finFET device and a wimpy vertical transport finFET device to be fabricated on the same substrate. An embodiment provides a method for fabricating finFET devices in such a manner that a nominal vertical transport finFET device and a wimpy vertical transport finFET device can be fabricated on the same semiconductor substrate. Thus, a substantial advancement of such devices or data processing systems by executing a method of an embodiment is in an improved fabrication of finFET devices in which it is desired to have a mixture of nominal vertical transport finFETs wimpy vertical transport finFET devices on the same semiconductor substrate or wafer.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
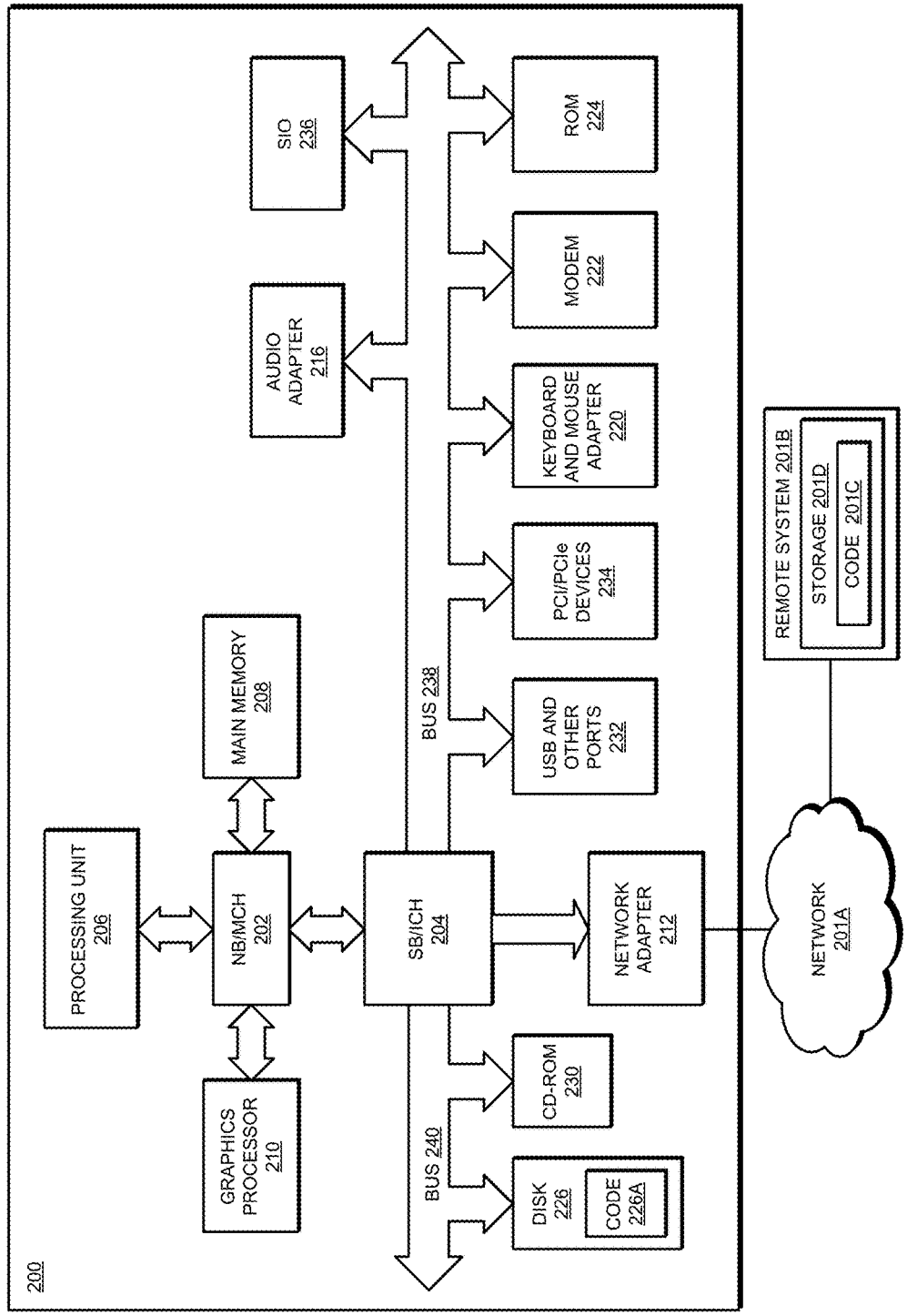
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more nominal vertical transport finFETs and wimpy vertical transport finFETs upon a substrate in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
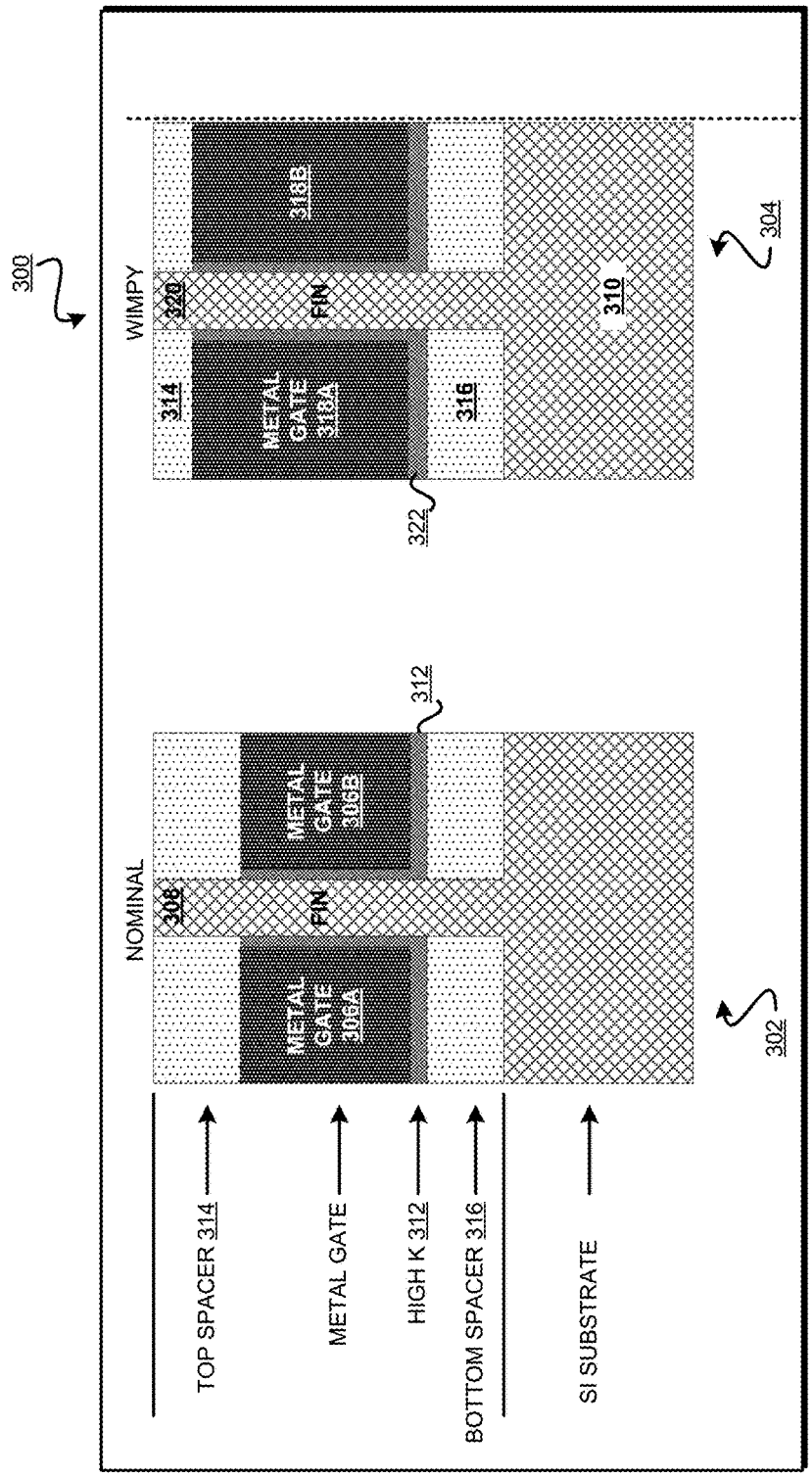
FIG. 3 depicts a block diagram of an example semiconductor device configuration according to an illustrative embodiment.

With reference to FIG. 3, this figure depicts a block diagram of an example semiconductor device configuration 300 according to an illustrative embodiment. Configuration 300 includes a nominal vertical transport (VT) finFET 302 and a wimpy vertical transport (VT) finFET 304 in accordance with an illustrative embodiment. Application 105 in FIG. 1 interacts with fabrication system 107 to produce or manipulate configuration 300 as described herein.

Nominal VT finFET 302 includes two gates 306A and 306B and a fin 308 coupling gates 306A and 306B. In one or more embodiments, fin 308 extends vertically (substantially perpendicular to the substrate layer) from a substrate 310. In particular embodiments, fin 308 and substrate 310 are each formed of a silicon material. In particular embodiments, gates 306A and 306B are formed of a metal material. Nominal VT finFET 302 further includes a high K dielectric material 312 disposed between gates 306A and 306B and fin 308. High K refers to a dielectric material having a relatively high dielectric constant as compared to that of fin 308. In the embodiment, an upper surface of each of gates 306A and 306B of nominal VT finFET 302 is below an upper surface of a portion of dielectric material 312 disposed between respective gates 306A and 306B and fin 308. Nominal VT finFET 302 further includes a top spacer 314 disposed on the top surface of gates 306A and 306B, and a bottom spacer 316 disposed between a bottom surface of gates 306A and 306B and substrate 310.

Wimpy VT finFET 304 includes two gates 318A and 318B and a fin 320 coupling gates 318A and 318B. In one or more embodiments, fin 320 extends vertically from substrate 310. In particular embodiments, fin 320 is formed of a silicon material. In particular embodiments, gates 318A and 318B are formed of a metal material. Wimpy VT finFET 304 further includes a high K dielectric material 322 disposed between gates 318A and 318B and fin 320. In the embodiment, an upper surface of each of gates 306A and 306B of nominal VT finFET 302 is substantially at the same height as the upper surface of a portion of dielectric material 322 disposed between respective gates 318A and 318B and fin 320. Wimpy VT finFET 304 further includes top spacer 314 disposed on the top surface of gates 318A and 318B, and bottom spacer 310 disposed between a bottom surface of gates 318A and 318B and substrate 310.

With reference to FIGS. 4-14, these figures depict an example process for fabricating wimpy VT finFETs and nominal VT finFETs on a common substrate in accordance with one or more illustrative embodiments. In the particular embodiments illustrated in FIGS. 4-14, a single wimpy VT finFET and two nominal VT finFETs are fabricated upon a single common substrate and/or wafer. It should be understood that in other embodiments, any combination of wimpy VT finFETs and nominal VT finFETs or other combinations of any numbers of nominal and wimpy vertical transport devices, may be fabricated on a single common substrate in a similar manner.

Figure 4:
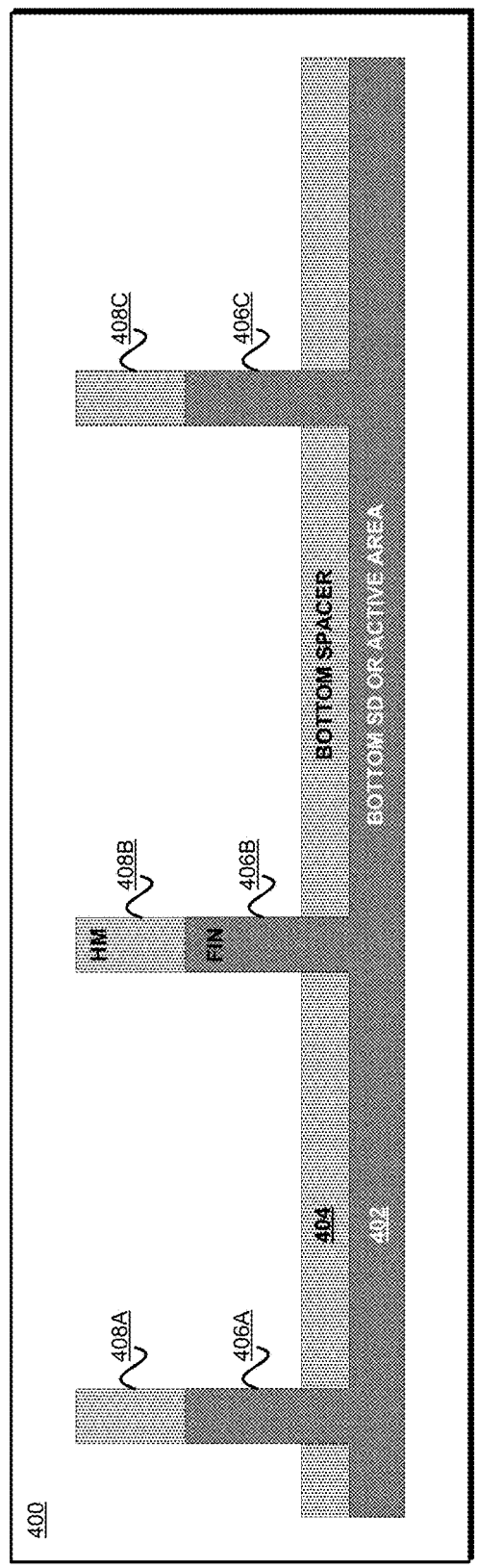
FIG. 4 depicts a portion of a process according to an illustrative embodiment.

With reference to FIG. 4, depicts a portion of a process in which a substrate structure 400 is received according to an illustrative embodiment in which a bottom substrate deposition (SD) or active area 402, a bottom spacer 404, fins 406A, 406B, 406C, and fin hard masks (HMs) 408A, 408B, and 408C are formed on a wafer. Each of fins 406A, 406B, and 406C extend vertically from bottom substrate deposition 402. In a particular embodiment, bottom substrate deposition 402 and fins 406A-406C are formed of a common material. In the illustrated embodiment, fin 406A is to form a portion of a first wimpy VT finFET, fin 406B is to form a portion of a first nominal VT finFET, and fin 406C is to form a portion of a second nominal VT finFET. Bottom spacer 404 overlays the bottom substrate deposition 402.

Fin hard mask 408A is disposed on a top surface of fin 406A, fin hard mask 408B is disposed on a top surface of fin 406B, and fin hard mask 408C is disposed on fin 406C. Each of fin hard masks 408A-408C functions to protect the top surface of respective fins 406A-406C during portions of the fabrication process.

Figure 5:
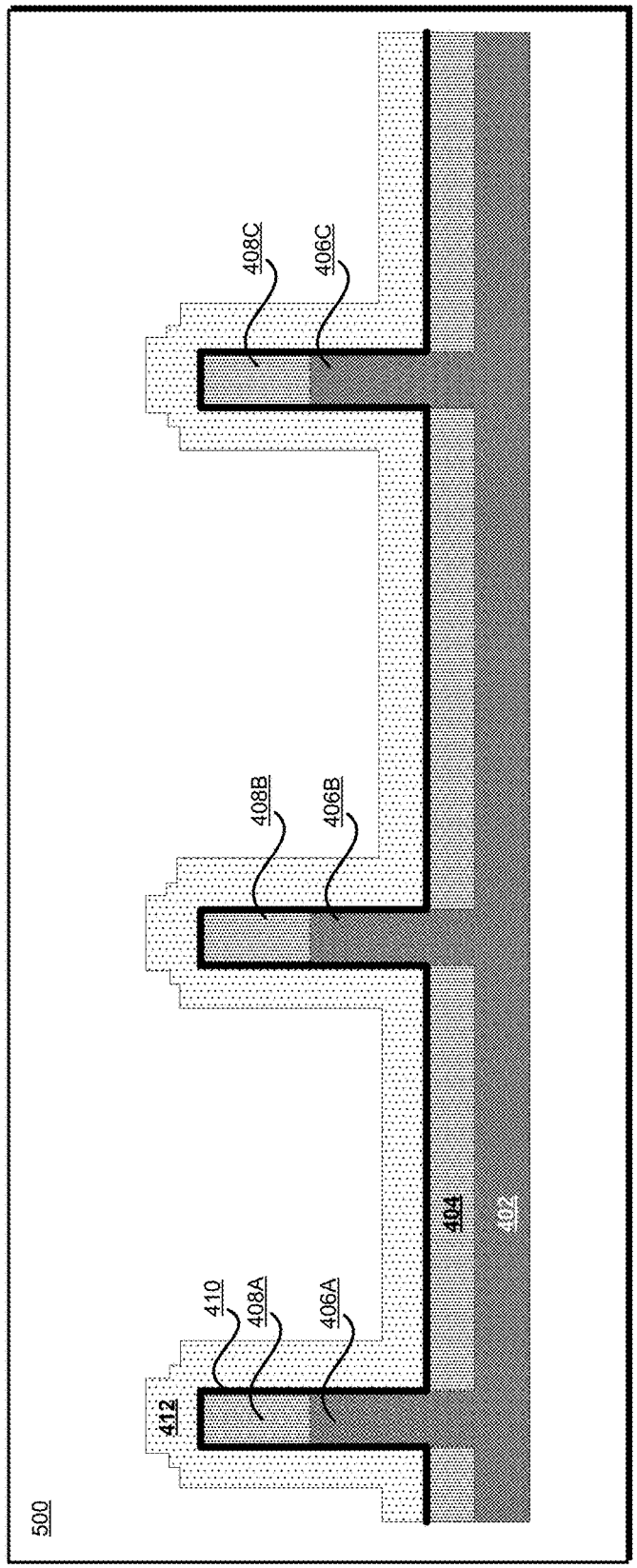
FIG. 5 depicts another portion of a process according to an illustrative embodiment.

With reference to FIG. 5 depicts another portion of a process in which structure 500 is formed according to an embodiment. In one or more embodiments, fabrication system 107 deposits gate dielectric material layer 410 upon the substrate structure 400 of FIG. 4. In various embodiments, gate dielectric material layer 410 is formed of a high-K dielectric material. As depicted in FIG. 4, gate dielectric material layer 410 overlays bottom spacer 404, portions of fins 406A-406C, and portions of fin hard masks 408A-408C. In one or more embodiments, fabrication system 107 deposits a gate work function metal (WFM) material layer 412 upon gate dielectric material layer 410. In particular embodiments, gate WFM material layer 412 may be formed of titanium nitride (TiN) or titanium carbide (TIC). In particular embodiments, a thickness of gate WFM material layer 412 is between 6 nm to 10 nm.

Figure 6:
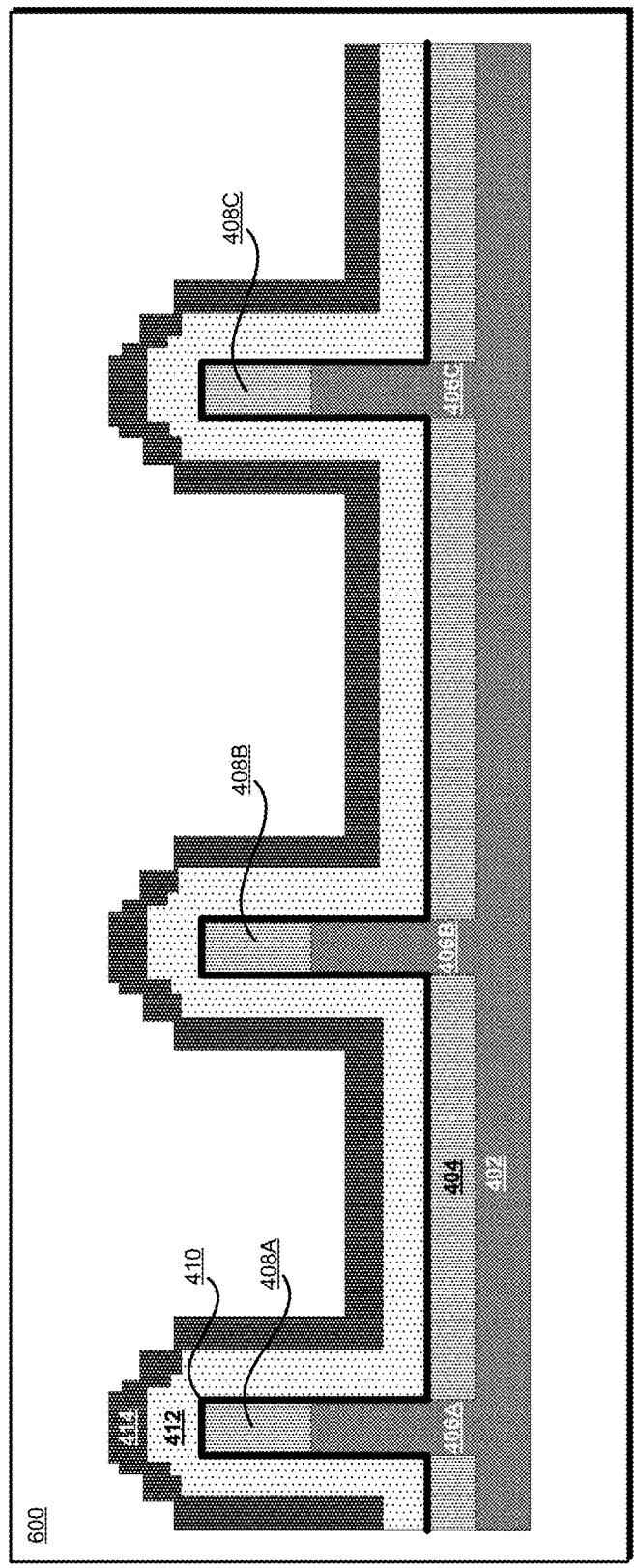
FIG. 6 depicts another portion of a process according to an illustrative embodiment.

With reference to FIG. 6 depicts another portion of a process in which a structure 600 is formed according to an embodiment. In one or more embodiments, fabrication system 107 deposits a conformal hard mask layer 414 upon WFM material layer 412 of the structure 500 of FIG. 5. In particular embodiments, conformal hard mask layer 414 is formed of a silicon nitride (SiN) material.

Figure 7:
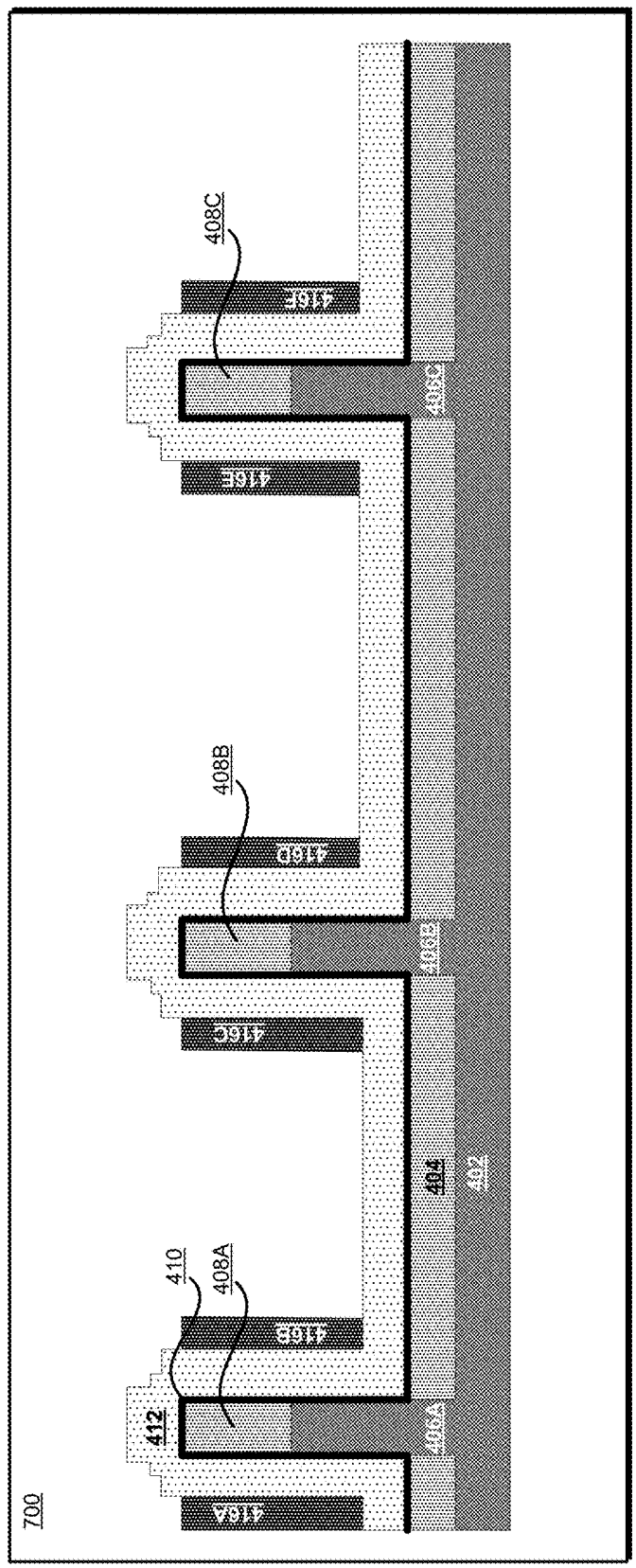
FIG. 7 depicts another portion of a process according to an illustrative embodiment.

With reference to FIG. 7 depicts another portion of a process in which a structure 700 is formed according to an embodiment. In one or more embodiments, fabrication system 107 performs an etching process on structure 600 of FIG. 6 to etch away a portion of conformal hard mask layer 414 to form self-aligned sidewall spacers 416A-416F out of the remaining material of conformal hard mask layer 414. In one or more embodiments, the term "self-aligned" refers to the sidewall spacers being formed and aligned from a directional reactive-ion etching (RIE) process instead of using a lithography mask to define and align where the sidewall spacers will be formed. Self-aligned sidewall spacers 416A and 416B are disposed on each side of fin 406A and fin hard mask 408A with gate dielectric material layer 410 and gate WFM material layer 412 therebetween. Self-aligned sidewall spacers 416C and 416D are disposed on each side of fin 406B and fin hard mask 408B with gate dielectric material layer 410 and gate WFM material layer 412 therebetween. Self-aligned sidewall spacers 416E and 416F are disposed on each side of fin 406C and fin hard mask 408C with gate dielectric material layer 410 and gate WFM material layer 412 therebetween. In a particular embodiment, the etching is performed by a reactive-ion etching (REI) process.

Figure 8:
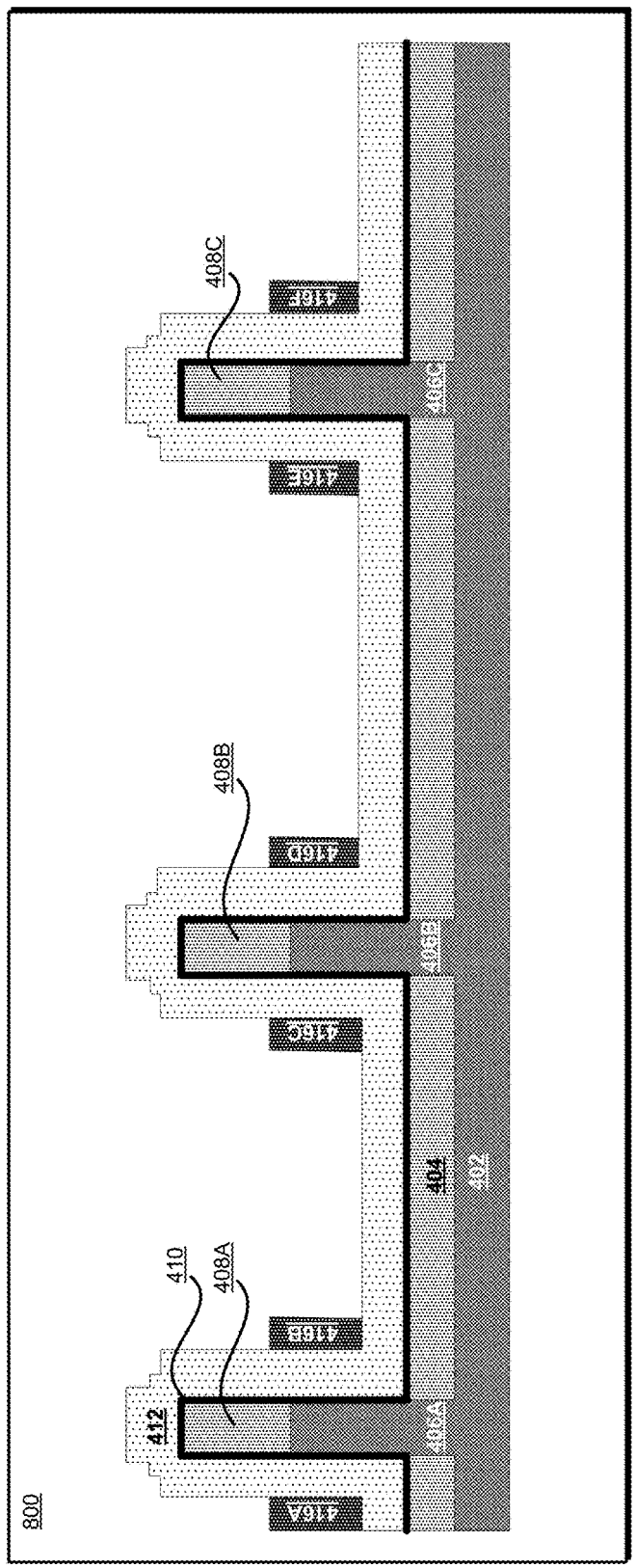
FIG. 8 depicts another portion of a process according to an illustrative embodiment.

With reference to FIG. 8 depicts another portion of a process in which a structure 800 is formed according to an embodiment. In one or more embodiments, fabrication system 107 etches self-aligned sidewall spacers 416A-416F of structure 700 of FIG. 7 to pull down self-aligned sidewall spacers 416A-416F to a desired gate length (Lg) of the wimpy VT finFET. In a particular embodiment, the etching is a performed by a reactive-ion etching (REI) process.

Figure 9:
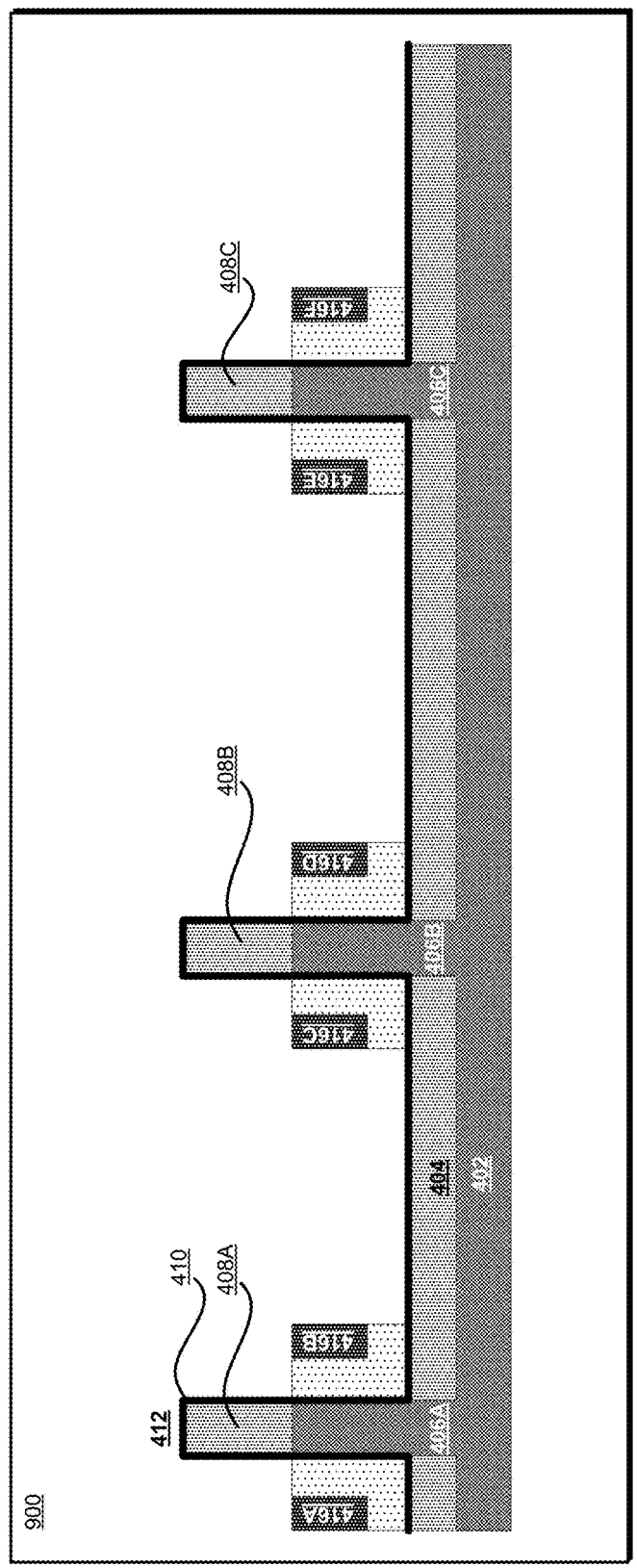
FIG. 9 depicts another portion of a process according to an illustrative embodiment.

With reference to FIG. 9 depicts another portion of a process in which a structure 900 is formed according to an embodiment. In one or more embodiments, fabrication system 107 etches gate WFM layer 412 to remove portions of gate WFM layer 412 of structure 800 of FIG. 8 down to gate dielectric material layer 410 to form a gate of the wimpy VT finFET. The portions of gate WFM layer 412 protected by self-aligned sidewall spacers 416A-416F are not etched during the etching process and remain substantially intact. In a particular embodiment, the etching process is a wet etching process such as a room temperature Standard Clean 1 (SC1) etching process.

Figure 10:
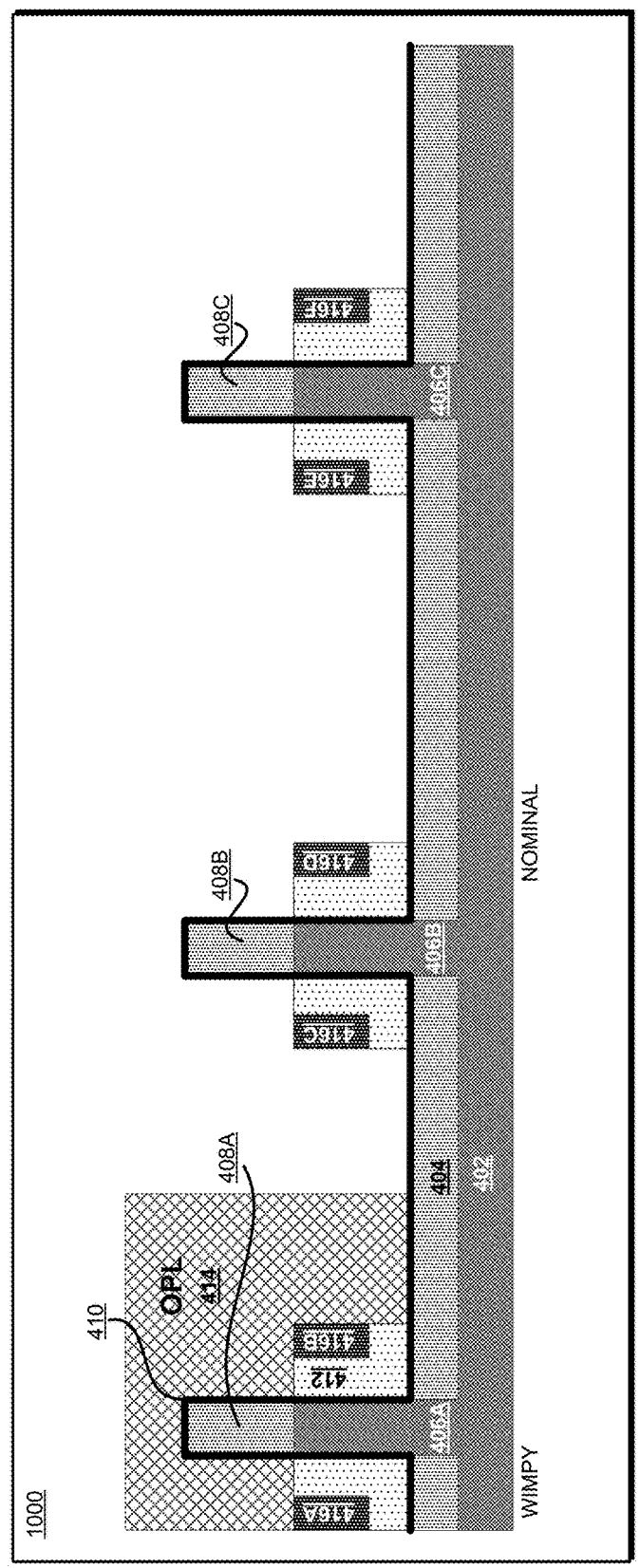
FIG. 10 depicts another portion of a process according to an illustrative embodiment.

With reference to FIG. 10 depicts another portion of a process in which a structure 1000 is formed according to an embodiment. In one or more embodiments, fabrication system 107 applies a lithographic mask 414 to the wimpy VT finFET area of structure 900 of FIG. 9 including fin 406A, fin hard mask 408A, portions of dielectric 410, portions of gate WFM layer 412, self-aligned sidewall spacer 416A, and self-aligned sidewall spacer 416B. In one or more embodiments, fabrication system 107 applies lithographic projection to lithographic mask 414 to transfer a pattern of lithographic mask 414 onto the wimpy VT finFET area. In particular embodiments, an REI process is used to transfer the pattern of lithographic mask 414. In one or more embodiments, lithographic mask 414 is an optical planarizing layer (OPL).

Figure 11:
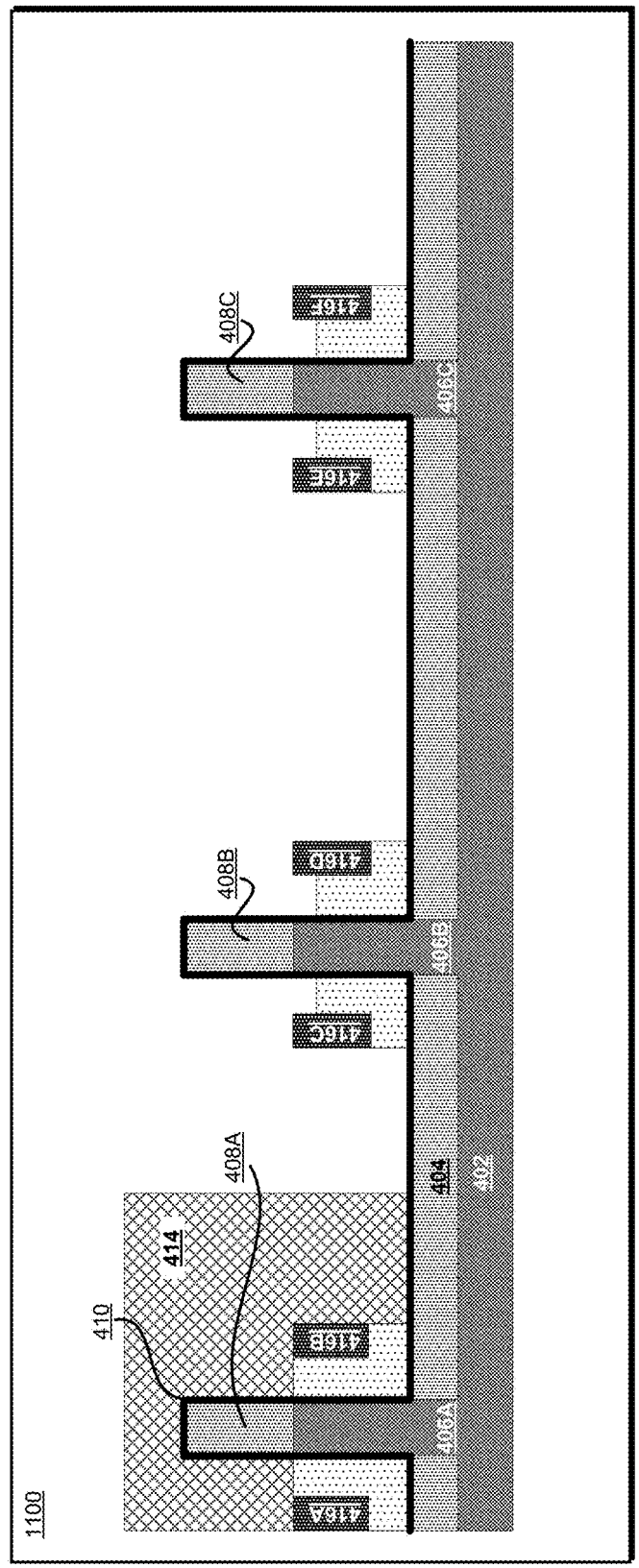
FIG. 11 depicts another portion of a process according to an illustrative embodiment.

With reference to FIG. 11 depicts another portion of a process in which a structure 1100 is formed according to an embodiment. In one or more embodiments, fabrication system 107 recesses portions of gate WFM layer 412 on the nominal VT finFET areas of structure 1100 below the upper surface of self-aligned sidewall spacers 416C-416D to form the gates of the nominal VT finFETs. In one or more embodiments, fabrication system 107 recesses the portions of gate WFM layer 412 using an etching process. In particular embodiments, the etching process is a dry etching process.

Figure 12:
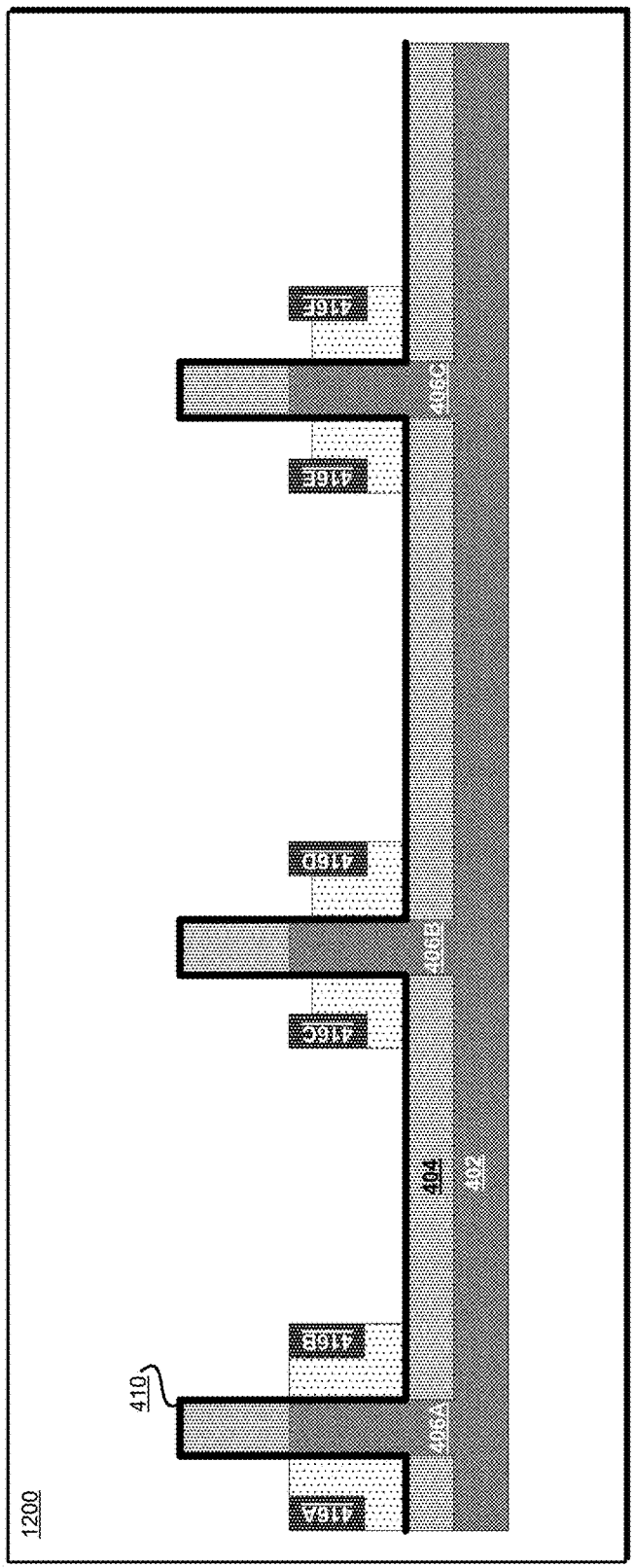
FIG. 12 depicts another portion of a process according to an illustrative embodiment.

With reference to FIG. 12 depicts another portion of a process in which a structure 1200 is formed according to an embodiment. In one or more embodiments, fabrication system 107 removes lithographic mask 414 from the wimpy VT finFET area of structure 1100 of FIG. 11. In one or more embodiments, fabrication system 107 removes lithographic mask 414 from the wimpy VT finFET area by a stripping process.

Figure 13:
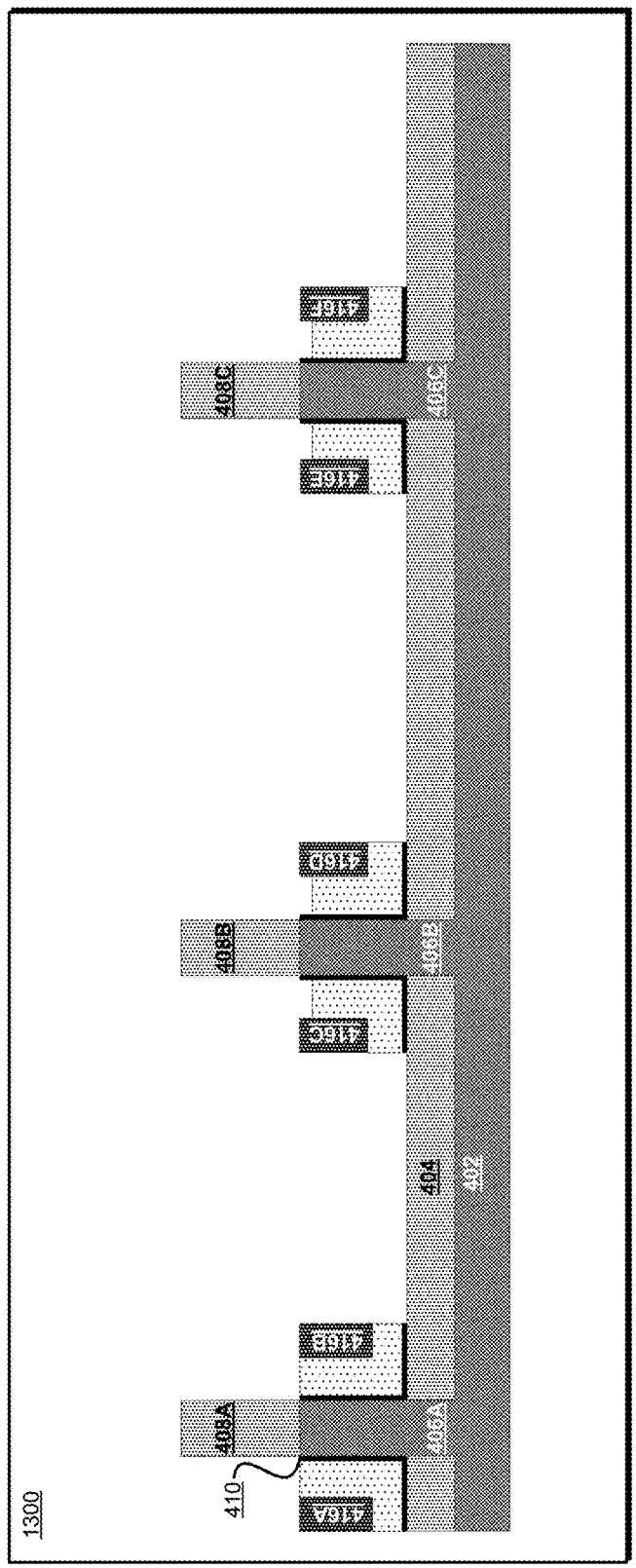
FIG. 13 depicts another portion of a process according to an illustrative embodiment.

With reference to FIG. 13 depicts another portion of a process in which a structure 1300 is formed according to an embodiment. In one or more embodiments, fabrication system 107 etches away portions of dielectric material layer 410 not protected by the remaining portions of gate WFM layer 412 from structure 1200 of FIG. 12. As a result, the remaining portions of dielectric material layer 410 are self-aligned to the gate length of the respective VT finFETs.

Figure 14:
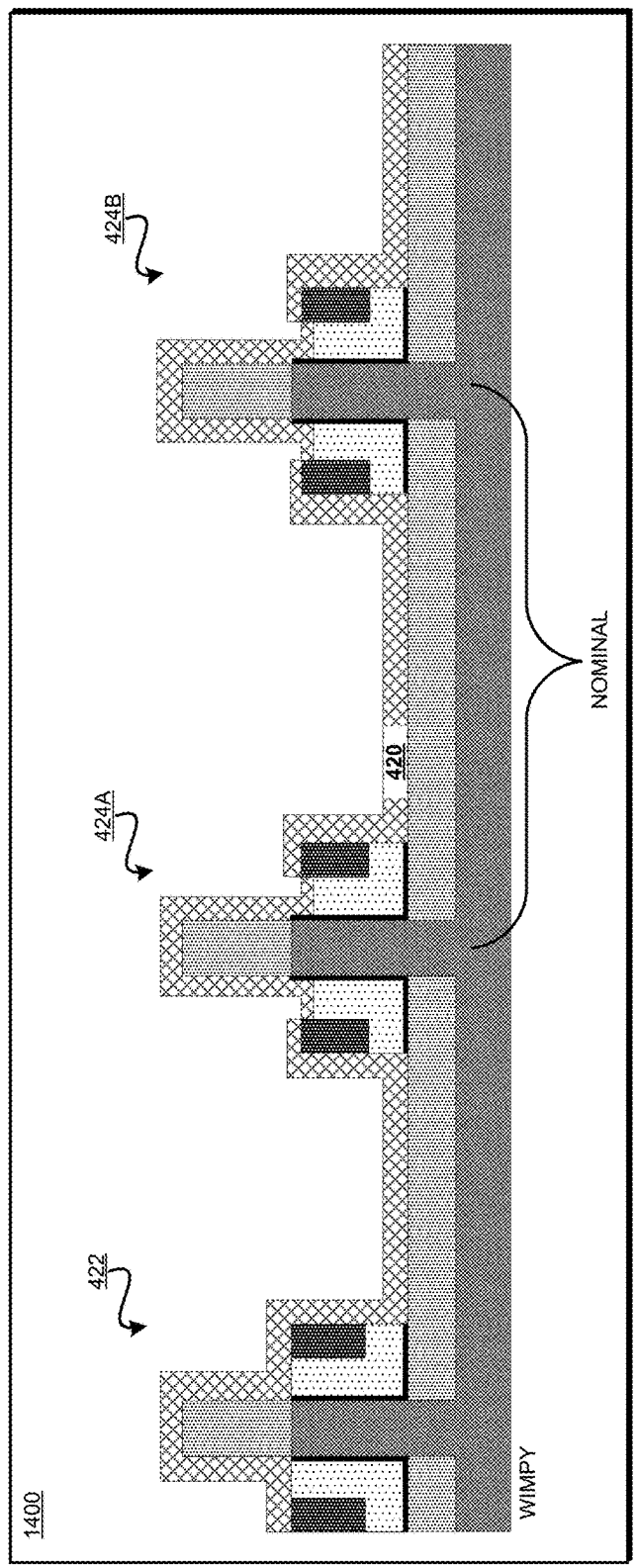
FIG. 14 depicts another portion of a process according to an illustrative embodiment.

With reference to FIG. 14 depicts another portion of a process in which a structure 1400 is formed according to an embodiment. In one or more embodiments, fabrication system 107 deposits a conformal material layer 420 upon the structure 1300 of FIG. 13 to encapsulate the gates of the wimpy VT finFET and nominal VT finFETs. As a result, a wimpy VT FinFET device 422, a first nominal VT finFET device 424A, and a second nominal VT finFET device 424B are fabricated on a common substrate.

Figure 15:
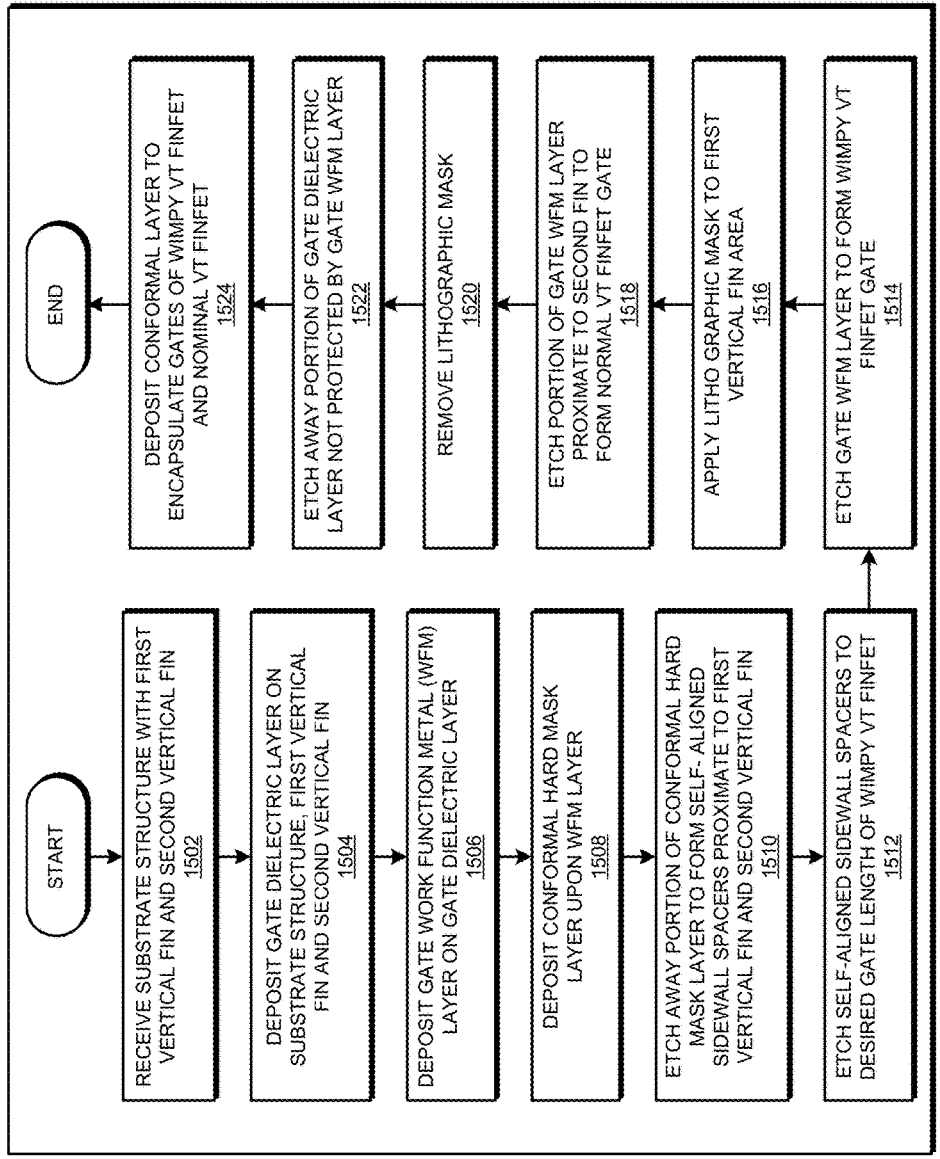
FIG. 15 depicts a flowchart of an example process for fabricating a wimpy semiconductor device structure and a nominal semiconductor device structure for vertical finFETs upon a common substrate in accordance with an illustrative embodiment.

With reference to FIG. 15 depicts a flowchart of an example process 1500 for fabricating a wimpy semiconductor device structure and a nominal semiconductor device structure for vertical finFETs upon a common substrate in accordance with an illustrative embodiment. Process 1500 can be implemented in fabrication system 100 in FIG. 1, to perform one or more steps of FIGS. 4-14 as needed in process 1500.

In block 1502, fabrication system 107 receives a substrate structure having a first vertical fin and a second vertical fin disposed thereon. In one or more embodiments, the substrate structure may include a bottom spacer disposed upon a top surface of a substrate deposition. In one or more embodiments, the first vertical fin has a first fin hard mask disposed on a top surface of the first vertical fin, and the second vertical fin has a second fin hard mask disposed on a top surface of the second vertical fin. In one or more embodiments, the first vertical fin and the second vertical fin are each substantially orthogonal to a plane of the substrate structure such that a source to drain flow in the first vertical fin occurs in a substantially perpendicular direction relative to the plane of the substrate.

In block 1504, fabrication system 107 deposits a gate dielectric layer on the substrate structure, the first vertical fin, and the second vertical fin. In one or more embodiments, the gate dielectric layer is formed of a high-K dielectric material. In one or more embodiments, the gate dielectric layer overlays the bottom spacer and portions of the first fin, portions of the second fin, portions of the first fin hard mask, and portions of the second fin hard mask.

In block 1506, fabrication system 107 deposits a gate work function metal (WFM) layer on the gate dielectric layer. In particular embodiments, the gate WFM layer may be formed of titanium nitride (TiN) or titanium carbide (TiC). In block 1508, fabrication system 107 deposits a conformal hard mask layer upon the WFM layer. In particular embodiments, the conformal hard mask layer is formed of a silicon nitride (SiN) material.

In block 1510, fabrication system 107 etches away a portion of the conformal hard mask layer to form a first self-aligned sidewall spacer proximate to the first vertical fin and a second self-aligned sidewall spacer proximate to the second vertical fin. In a particular embodiment, the first self-aligned sidewall spacer includes a sidewall spacer disposed on a first side and a second side of the first vertical fin, and the at last a second self-aligned sidewall spacer includes a sidewall spacer disposed on a first side and a second side of the second vertical fin. In a particular embodiment, the etching is performed by a reactive-ion etching (RIE) process.

In block 1512, fabrication system 107 etches the first self-aligned sidewall spacer and the second self-aligned sidewall spacer to pull down the self-aligned sidewall spacers to a desired gate length (Lg) of the wimpy VT finFET. In a particular embodiment, the etching is a performed by a reactive-ion etching (RIE) process.

In block 1514, fabrication system 107 etches the gate WFM layer to remove a portion of the gate WFM layer extending down to the gate dielectric layer to form a gate of the wimpy VT finFET. In one or more embodiments, the portions of the gate WFM layer protected by the self-aligned sidewall spacers are not etched during the etching process and remain substantially intact. In a particular embodiment, the etching process is a wet etching process.

In block 1516, fabrication system 107 applies a lithographic mask to the wimpy VT finFET area proximate to the first vertical fin including the first vertical fin, the first fin hard mask, portions of the dielectric layer proximate to the first vertical fin, portions of gate WFM layer proximate to the first vertical fin, and the first self-aligned sidewall spacer. In one or more embodiments, fabrication system 107 applies lithographic projection to the lithographic mask 414 to transfer a pattern of lithographic mask onto the wimpy VT finFET area. In particular embodiments, an REI process is used to transfer the pattern of the lithographic mask to the wimpy VT finFET area. In one or more embodiments, the lithographic mask is an optical planarizing layer (OPL).

In block 1518, fabrication system 107 etches a portion of the gate WFM layer on the nominal VT finFET area proximate to the second vertical fin to recess the portion of the gate WFM layer below an upper surface of the a second self-aligned sidewall spacer to form a gate of the nominal VT finFET. In particular embodiments, the etching process is a dry etching process. In block 1520, fabrication system 107 removes the lithographic mask 414 from the wimpy VT finFET area. In one or more embodiments, fabrication system 107 removes lithographic mask 414 from the wimpy VT finFET area by a stripping process.

In block 1522, fabrication system 107 etches away or otherwise removing a portion of the gate dielectric layer not protected by the remaining portions of gate WFM layer. As a result, the remaining portions of the dielectric layer are self-aligned to the gate length of the respective VT finFETs. In 1524, fabrication system 108 deposits a conformal layer to encapsulate the gates of the wimpy VT finFET and nominal VT finFETs. As a result of process 1500, a wimpy VT FinFET device and a nominal VT finFET device are fabricated on a common substrate. The fabrication system 107 ends process 1500 thereafter.

Thus, a computer implemented method, system or apparatus, and computer program product are provided in the illustrative embodiments for fabricating wimpy semiconductor device structures and nominal semiconductor device structures for VT finFETs on a common substrate and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    forming a first vertical fin and a second vertical fin on a substrate structure, wherein a dielectric layer is disposed on the substrate structure, the first vertical fin, and the second vertical fin, wherein a work function metal (WFM) layer is disposed on the dielectric layer, and wherein the first vertical fin and the second vertical fin are each substantially orthogonal to a plane of the substrate structure such that a source to drain flow in the first vertical fin occurs in a substantially perpendicular direction relative to the plane of the substrate;
    forming a first sidewall spacer proximate to the first vertical fin and a second sidewall spacer proximate to the second vertical fin;
    applying a lithographic mask to a first area proximate to the first vertical fin including the first vertical fin, and a portion of the WFM layer proximate to the first vertical fin;
    recessing a portion of the WFM layer proximate to the second sidewall spacer below an upper surface of the second sidewall spacer;
    removing the lithographic mask from the first area proximate to the first vertical fin; and
    removing a portion of the dielectric layer to produce a wimpy vertical transport device and a nominal vertical transport device on the substrate structure.

2. The method of claim 1, further comprising:
    further applying the lithographic mask to a portion of the dielectric layer proximate to the first vertical fin, and the first sidewall spacer.

3. The method of claim 1, further comprising:
    removing, as a part of removing the portion of the dielectric layer, a portion of the dielectric layer that is unprotected by a remaining portion of the WFM layer.

4. The method of claim 1, further comprising:
    etching, as a part of removing the portion of the dielectric layer, the portion of the dielectric layer.

5. The method of claim 1, wherein a conformal mask layer is disposed on the work function metal layer.

6. The method of claim 5, further comprising:
    forming the first sidewall spacer and the second sidewall spacer from the conformal mask layer.

7. The method of claim 5, wherein forming the first sidewall spacer and the second sidewall spacer comprises:
    etching a portion of the conformal mask layer; and
    etching the first self-aligned sidewall spacer and the second self-aligned sidewall spacer to a desired gate length of the wimpy vertical transport device.

8. The method of claim 1, further comprising:
    performing the etching of the first sidewall spacer and the second sidewall spacer using a reactive-ion etching (RIE) process.

9. The method of claim 8, further comprising:
    etching the WFM layer to remove a portion of the WFM layer extending to the dielectric layer to form a gate of the wimpy vertical transport device.

10. The method of claim 1, further comprising performing the recessing of the portion of the WFM layer proximate to the second sidewall spacer by etching the portion of the WFM layer proximate to the second sidewall spacer below an upper surface of the second sidewall spacer.

11. The method of claim 10, further comprising performing the etching of the portion of the WFM layer proximate to the second sidewall spacer using a reactive-ion etching (RIE) process.

12. The method of claim 1, further comprising performing the removing of the lithographic mask from the first area by stripping the lithographic mask from the first area.

13. The method of claim 1, further comprising depositing a conformal layer to encapsulate the wimpy vertical transport device and the nominal vertical transport device.

14. The method of claim 1, wherein the wimpy vertical transport device is a wimpy vertical transport finFET, and wherein the nominal vertical transport device is a nominal vertical transport finFET.

15. A computer usable program product comprising one or more computer-readable storage devices, and program instructions stored on at least one of the one or more storage devices, the stored program instructions comprising:
    program instructions to form a first vertical fin and a second vertical fin on a substrate structure, wherein a dielectric layer is disposed on the substrate structure, the first vertical fin, and the second vertical fin, wherein a work function metal (WFM) layer is disposed on the dielectric layer, and wherein the first vertical fin and the second vertical fin are each substantially orthogonal to a plane of the substrate structure such that a source to drain flow in the first vertical fin occurs in a substantially perpendicular direction relative to the plane of the substrate;
    program instructions to form a first sidewall spacer proximate to the first vertical fin and a second sidewall spacer proximate to the second vertical fin;
    program instruction to apply a lithographic mask to a first area proximate to the first vertical fin including the first vertical fin, and a portion of the WFM layer proximate to the first vertical fin;
    program instructions to recess a portion of the WFM layer proximate to the second sidewall spacer below an upper surface of the second sidewall spacer;
    program instructions to remove the lithographic mask from the first area proximate to the first vertical fin; and
    program instructions to remove a portion of the dielectric layer to produce a wimpy vertical transport device and a nominal vertical transport device on the substrate structure.

16. The computer usable program product of claim 15 further comprising:
  program instructions to further apply the lithographic mask to a portion of the dielectric layer proximate to the first vertical fin, and the first sidewall spacer.

17. The computer usable program product of claim 15, further comprising:
  program instructions to remove, as a part of removing the portion of the dielectric layer, a portion of the dielectric layer that is unprotected by a remaining portion of the WFM layer.

18. The computer usable program product of claim 15, wherein the computer usable code is stored in a computer readable storage device in a data processing system, and wherein the computer usable code is transferred over a network from a remote data processing system.

19. The computer usable program product of claim 15, wherein the computer usable code is stored in a computer readable storage device in a server data processing system, and wherein the computer usable code is downloaded over a network to a remote data processing system for use in a computer readable storage device associated with the remote data processing system.

20. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:
  program instructions to form a first vertical fin and a second vertical fin on a substrate structure, wherein a dielectric layer is disposed on the substrate structure, the first vertical fin, and the second vertical fin, wherein a work function metal (WFM) layer is disposed on the dielectric layer, and wherein the first vertical fin and the second vertical fin are each substantially orthogonal to a plane of the substrate structure such that a source to drain flow in the first vertical fin occurs in a substantially perpendicular direction relative to the plane of the substrate;
  program instructions to form a first sidewall spacer proximate to the first vertical fin and a second sidewall spacer proximate to the second vertical fin;
  program instruction to apply a lithographic mask to a first area proximate to the first vertical fin including the first vertical fin, and a portion of the WFM layer proximate to the first vertical fin;
  program instructions to recess a portion of the WFM layer proximate to the second sidewall spacer below an upper surface of the second sidewall spacer;
  program instructions to remove the lithographic mask from the first area proximate to the first vertical fin; and
  program instructions to remove a portion of the dielectric layer to produce a wimpy vertical transport device and a nominal vertical transport device on the substrate structure.

\* \* \* \* \*